(12) United States Patent
Lewis et al.

(10) Patent No.: US 10,264,669 B2
(45) Date of Patent: Apr. 16, 2019

(54) FLEXIBLE ELECTRONIC ASSEMBLIES WITH EMBEDDED ELECTRONIC DEVICES AND METHODS FOR THEIR FABRICATION

(71) Applicant: Research Triangle Institute, Research Triangle Park, NC (US)

(72) Inventors: Jay Lewis, Durham, NC (US); Dorota Temple, Cary, NC (US); Erik Vick, Raleigh, NC (US); Ethan Klem, Durham, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 61 days.

(21) Appl. No.: 15/141,149

(22) Filed: Apr. 28, 2016

(65) Prior Publication Data

US 2017/0064810 A1  Mar. 2, 2017

Related U.S. Application Data

(60) Provisional application No. 62/155,689, filed on May 1, 2015.

(51) Int. Cl.
| | |
|---|---|
| *H05K 1/00* | (2006.01) |
| *H05K 1/02* | (2006.01) |
| *H05K 1/18* | (2006.01) |
| *H05K 3/30* | (2006.01) |
| *H05K 3/40* | (2006.01) |
| *H05K 3/46* | (2006.01) |
| *H05K 1/11* | (2006.01) |

(52) U.S. Cl.
CPC ............. *H05K 1/028* (2013.01); *H05K 1/115* (2013.01); *H05K 1/185* (2013.01); *H05K 3/301* (2013.01); *H05K 3/4038* (2013.01); *H05K 3/4602* (2013.01); *H05K 2201/10522* (2013.01)

(58) Field of Classification Search
CPC ........ H05K 1/028; H05K 1/115; H05K 1/185; H05K 2201/10522; H05K 3/301; H05K 3/4038; H05K 3/4602
See application file for complete search history.

(56) References Cited

U.S. PATENT DOCUMENTS

| | | | | |
|---|---|---|---|---|
| 5,350,594 | A  * | 9/1994 | Unruh | H05K 1/0218 |
| | | | | 427/410 |
| 6,370,013 | B1 * | 4/2002 | Iino | H01G 4/2325 |
| | | | | 257/E23.062 |
| 2002/0117743 | A1 * | 8/2002 | Nakatani | H01L 21/4857 |
| | | | | 257/687 |
| 2006/0152913 | A1 * | 7/2006 | Richey | H05K 1/0218 |
| | | | | 361/818 |

(Continued)

*Primary Examiner* — Yuriy Semenenko
(74) *Attorney, Agent, or Firm* — Olive Law Group, PLLC

(57) ABSTRACT

A flexible electronic assembly includes a flexible current-carrying device, an electrically insulating flexible substrate, and an electronic device embedded in the substrate. The electronic device is mounted face-down on the current-carrying device such that a contact side or component side of the electronic device faces the current-carrying device and is positioned at an interface between the current-carrying device and the substrate. The current-carrying device, substrate, and electronic device are co-planar at the interface. This configuration enables the flexible electronic assembly to have an ultra-thin thickness, for example on the order of micrometers.

31 Claims, 6 Drawing Sheets

(56) References Cited

U.S. PATENT DOCUMENTS

| | | | | |
|---|---|---|---|---|
| 2010/0090781 A1* | 4/2010 | Yamamoto | .............. | H01L 23/66 |
| | | | | 333/167 |
| 2013/0229776 A1* | 9/2013 | Ma | ........................ | H05K 1/185 |
| | | | | 361/749 |
| 2014/0110859 A1* | 4/2014 | Rafferty | .............. | H01L 23/4985 |
| | | | | 257/774 |
| 2015/0021081 A1* | 1/2015 | Mitarai | .................. | H05K 1/186 |
| | | | | 174/260 |
| 2017/0231098 A1* | 8/2017 | Zluc | ........................ | H05K 3/305 |

* cited by examiner

FLEXIBLE ELECTRONIC ASSEMBLIES WITH EMBEDDED ELECTRONIC DEVICES AND METHODS FOR THEIR FABRICATION

RELATED APPLICATIONS

This application claims the benefit of U.S. Provisional Patent Application Ser. No. 62/155,689, filed May 1, 2015, titled "FLEXIBLE ELECTRONIC ASSEMBLIES WITH EMBEDDED ELECTRONIC DEVICES AND METHODS FOR THEIR FABRICATION," the content of which is incorporated by reference herein in its entirety.

FEDERALLY SPONSORED SUPPORT

The invention was made with government support under Contract No. W911NF-14-C-0100 awarded by the Army Research Office (ARO) of the United States Army. The United States Government has certain rights to the invention.

TECHNICAL FIELD

The present invention relates generally to electronic assemblies and methods for their fabrication, and particularly to electronic assemblies that are thin and flexible and in which electronic devices are embedded.

BACKGROUND

Flexible electronics are presently of significant interest and the subject of active research and development. To date, a variety of processes for fabricating flexible, thin integrated circuits have been demonstrated or suggested. One example is silicon-on-insulator (SOI) wafer-based processes, which typically rely on complementary metal-oxide-semiconductor (CMOS) technology. While CMOS-on-SOI approaches allow the use of well-developed and widely available foundry processes, custom integrated circuits (ICs) on SOI substrates must be produced for all functional components of the circuit. These IC die fabricated in the thin Si layer of the SOI wafer are then separated from the rest of the substrate and embedded into the flexible substrate. Another example is transfer printing, which involves transferring small "chiplets" from a source wafer to a flexible substrate. However, transfer printing requires custom components as well. Moreover, for complex, large-area circuits, transfer printing does not leverage traditional circuit design due to segmentation of the process into different chips, consequently reducing performance due to lag time. Another example is direct fabrication, which involves depositing amorphous silicon (Si) or poly-Si directly onto flexible substrates and fabricating transistors and other electronic devices on these flexible substrates. Thus far, however, direct fabrication has suffered from significantly reduced performance in comparison to state-of-the-art (CMOS) technology.

In view of the foregoing, there is an ongoing need for new or at least improved flexible and thin electronics and methods for their fabrication.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one embodiment, a flexible electronic assembly includes: a flexible current-carrying device comprising a front side, an opposing back side, a first electrically insulating material, and a metal component embedded in the first electrically insulating material; a flexible substrate composed of a second electrically insulating material and comprising a front side and an opposing back side; and an electronic device embedded in the flexible substrate and comprising a front side, an opposing back side, and an electrical contact on the front side, wherein the front side of the flexible substrate and the front side of the electronic device contact the back side of the flexible current-carrying device at an interface, such that the flexible substrate and the electronic device are coplanar with the flexible current-carrying device at the interface.

According to another embodiment, a flexible electronic assembly includes flexible multilevel metal (MLM) structure, a flexible substrate, and one or more electronic devices embedded in the flexible substrate. The flexible MLM structure includes: a front side; an opposing back side; a first electrically insulating material; one or more patterned layers of metal embedded in the first electrically insulating material at one or more respective levels between the front side and the back side, each patterned layer comprising one or more metal components; and one or more electrical contacts on the front side. The flexible substrate is composed of a second electrically insulating material and includes a front side and an opposing back side. Each electronic device includes: a front side, an opposing back side, and an electrical contact on the front side. The front side of the flexible substrate and the front side of the one or more electronic devices contact the back side of the flexible MLM structure at an interface, such that the flexible substrate and the one or more electronic devices are coplanar with the flexible MLM structure at the interface.

According to another embodiment, a method for fabricating an electronic package includes: forming a flexible current-carrying device comprising a front side, an opposing back side, a first electrically insulating material, and a metal component embedded in the first electrically insulating material; mounting an electronic device on the flexible current-carrying device, the electronic device comprising a front side, an opposing back side, and an electrical contact on the front side, wherein the front side of the electronic device contacts the back side of the flexible current-carrying device at an interface; and forming a flexible substrate on the flexible current-carrying device such that the electronic device is embedded in the flexible substrate, the flexible substrate composed of a second electrically insulating material and comprising a front side and an opposing back side, wherein the front side of the flexible substrate contacts the back side of the flexible current-carrying device at the interface, and the flexible substrate and the electronic device are coplanar with the flexible current-carrying device at the interface.

According to another embodiment, a flexible electronic assembly is provided, which is fabricated according to any of the methods disclosed herein.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
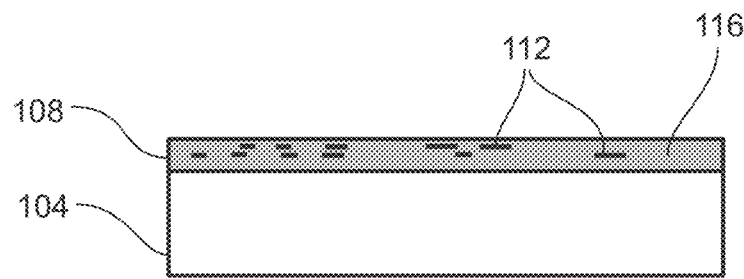
FIG. 1 is a schematic cross-sectional view illustrating an example of a method for fabricating a flexible electronic assembly according to some embodiments, in which an electrical current-carrying device is formed on a first carrier.

FIGS. 1 to 9 are schematic cross-sectional views illustrating an example of a method for fabricating a flexible electronic assembly according to some embodiments of the present disclosure. As a general matter, various techniques and materials utilized in the fabrication of flexible circuits, electronic packages, and the like are known to persons skilled in the art. Accordingly, such techniques and materials are only briefly described herein as necessary to facilitate an understanding of the subject matter disclosed herein.

For reference purposes, the terms "vertical" and "thickness" refer to the direction that is vertical (from top to bottom, or vice versa) from the perspective of FIGS. 1 to 9. The terms "plane" and "planar" refer to planes orthogonal to the vertical direction. Thus, a plane is defined by two axes (or "planar directions") orthogonal to each other and to the vertical direction, with one of the axes passing through the drawing sheets containing FIGS. 1 to 9 and the other axis being horizontal across the drawing sheets (from left to right, or vice versa) from the perspective of FIGS. 1 to 9. The term "vertical" is used merely in a relative sense and not as a limitation on the orientation of the presently disclosed flexible electronic assembly or any of its components. It will also be noted that, as the planar structures described herein are flexible, a plane may be a curved plane. Thus, a plane is orthogonal to the vertical direction in a nominal sense, i.e., when a planar structure is in an unbent or unbowed state. Hence, the terms "plane" and "planar" are not intended to imply any degree of straightness or flatness.

Also for reference purposes, the terms "front side" (or "front surface"), "back side" (or "back surface"), and "lateral side" (or "lateral surface") are used in a relative sense to distinguish the different sides or surfaces of a planar structure. Examples of planar structures are the flexible electronic assembly as a whole as well as planar components that are part of the flexible electronic assembly. Generally, a planar structure has a front side, a back side opposing the front side, and one or more lateral sides between the front side and back side. From the perspective of FIGS. 1 to 9, the front side and the back side lie in "planes" as described above, and thus generally may be parallel or substantially parallel to each other. A given lateral side may or may not be orthogonal to the front side and back side. The planar structure has a thickness defined between the front side and the back side, along a direction orthogonal to the front side and back side, i.e., along the "vertical" direction or "thickness" direction as described above. The overall size or form factor of the planar structure is often predominantly dictated by the surface area of the front side and back side, with one or both dimensions (e.g., length and width) defining the surface area being appreciably greater than the thickness. Thus, for example, the planar structure may have the shape of a plate or disk. The front side and back side may be round, in which case the planar structure may be considered as essentially having a single lateral side contiguously extending around its perimeter. Alternatively, the front side and back side may be polygonal, in which case the planar structure has multiple lateral sides adjoined at discernable edges or corners. From the perspective of FIGS. 1 to 9, the front side and the back side of a given planar structure generally correspond to the bottom (lower) side and the top (upper) side, respectively, of that planar structure.

Also for reference purposes, the term "coplanar" is used to indicate that two or more, either front-side or back-side, surfaces of the components of the flexible electronic assembly lie in the same plane, i.e., the two or more surfaces are adjacent to (and possibly spaced from) each other along the same plane, or lie facing each other on either side of a common plane in physical contact with each other along the plane. In the latter case, two surfaces may be coplanar while a discernable bond line or adhesion film exists at their interface.

As used herein, the term "electrically insulating" generally encompasses the term "dielectric" unless specified otherwise or the context dictates otherwise. For example, a dielectric material may be specifically employed to provide a desired function at a particular location of the flexible electronic assembly, such as providing a capacitor, facilitating transmission of a radio frequency (RF) signal, etc. As used herein, the term "radio frequency" or "RF" generally encompasses the term "microwave" or "MW" unless specified otherwise or the context dictates otherwise.

Referring to FIG. 1, a blank first carrier 104 (i.e., a wafer or substrate) is provided. The first carrier 104 is typically composed of a material that is capable of being produced in a bulk size (i.e., having dimensions on the order of millimeters or greater). One non-limiting example is silicon (Si), although more generally the material may be an organic or inorganic material, and may be a dielectric or insulator, a semiconductor, a conductive material (encapsulated if needed for electromagnetic isolation), or a composite such as, for example, silicon-on-insulator (SOI). The first carrier 104 serves as a temporary carrier in that it provides mechanical support for components (layers, structures, devices, etc.) being fabricated as part of the flexible electronic assembly, but is eventually removed and hence does not form a part of the final flexible electronic assembly. The first carrier 104 may include an etch stop layer (not shown) of an appropriate composition such as, for example, silicon dioxide ($SiO_2$). Alternatively, in some embodiments, the first carrier 104 may not be completely removed, but instead may be thinned significantly such that it becomes flexible and can be incorporated into the final package.

Next, an electrical current-carrying device 108 is fabricated on a planar front surface of the first carrier 104. The current-carrying device 108 may include one or more metal components 112 embedded in an electrically insulating (or dielectric) material 116. The metal components 112 may be any electrically conductive structures configured to allow electrical current to flow, or to distribute electrical current, from at least one location to at least one other location. The metal components 112 are typically planar structures and may be elongated in one planar direction. For example, the metal components 112 may be strips or traces of metal. Examples of materials utilized to form the metal components 112 include, but are not limited to, copper, copper alloys, other metals and metal alloys (e.g., titanium, tungsten, titanium-tungsten, aluminum, gold, silver, tin, nickel, etc.), metal silicides ($MSi_x$, e.g., tungsten silicide, nickel silicide, etc.), etc. Generally, the electrically insulating material 116 may be composed of any electrically insulating (or dielectric) material in which high-precision vias may be formed. Examples of electrically insulating materials 116 include, but are not limited to, glasses, quartz, non-conductive oxides (e.g., metal oxides such as aluminum oxide, metalloid oxides such as silicon dioxide, etc.), non-conductive nitrides (e.g., metal nitrides, metalloid nitrides such as silicon nitride, etc.), diamond-like carbon (DLC), various ceramics, various organic polymers, etc. Examples of polymers include, but are not limited to, photoresists such as SU-8, polyimide (including co-polymers and blends thereof), polyparaxylylene or polyparaxylylene-based formulations (i.e., from the family of Parylenes), liquid crystal polymers (LCP), benzocyclobutene (BCB), etc.

In some embodiments, the current-carrying device 108 is or includes a multilevel metal (MLM) structure in which one or more metal components 112 are positioned at each of two or more different levels of the current-carrying device 108. In the present context, "different levels" refers to different elevations along the thickness of the current-carrying device 108. The MLM structure may be fabricated by forming alternating layers of an electrically conductive material and the electrically insulating (or dielectric) material 116, and forming one or more coplanar metal components 112 from each layer of electrically conductive material. The MLM structure typically also includes vertical interconnects providing electrical communication between the metal components 112 and other locations of the flexible electronic assembly.

More generally, the fabrication technique(s) utilized may depend on the composition of the electrically conductive material utilized to form the metal components 112 and the composition of the electrically insulating material 116. Various vacuum deposition (e.g., chemical vacuum deposition, physical vacuum deposition) techniques may be utilized. The electrically conductive material may be fabricated by another technique such as, for example, electroplating or evaporation. The electrically insulating material 116 may be fabricated by another technique such as, for example, a coating technique (e.g., spin-coating, spray-coating, dip-coating, flow-coating, etc.) or lamination. After each layer of electrically conductive material is formed on an underlying layer of electrically insulating material 116, that electrically conductive layer may be subjected to a patterning process (e.g., photolithography, or masking and etching) to form a pattern of coplanar metal components 112 at the level of that layer. As a result, the current-carrying device 108 may include a plurality of patterned electrically conductive layers disposed at a respective number of different levels, with each patterned layer defining one or more metal components 112, whereby the patterns are embedded in the electrically insulating material 116. When configured as an MLM structure, the current-carrying device 108 provides multilevel routing of electrical signals for the flexible electronic assembly. In some embodiments, one or more of the patterns may include one or more large-area, planar metal components 112 (electrically conductive planes, such as ground planes or power planes) to provide electrical communication with a plurality of components of the flexible electronic assembly. In some embodiments, the "pattern" of one or more of the electrically conductive layers may consist entirely of an electrically conductive plane instead of being a patterned arranged of multiple metal components 112.

The current-carrying device 108 may be formed to any desired thickness on the first carrier 104. Generally, the thickness and/or composition of the current-carrying device 108 is such that the current-carrying device 108 is flexible when free-standing or unsupported by the first carrier 104. In some embodiments, the thickness of the current-carrying device 108 is in a range from 0.5 to 20 µm.

Figure 2:
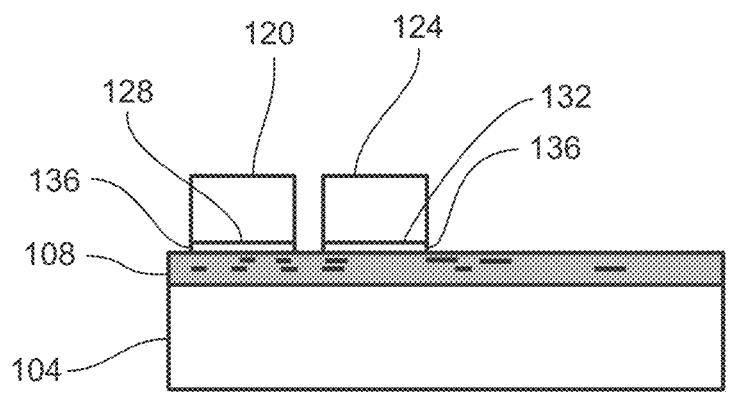
FIG. 2 is a schematic cross-sectional view illustrating the method, in which electronic devices are mounted face-down on a back side of the current-carrying device.

Referring to FIG. 2, after forming the current-carrying device 108, one or more electronic devices 120 and 124 (or microelectronic devices) are mounted face-down on the exposed surface of the current-carrying device 108, i.e., on the back side of the current-carrying device 108 opposite the front side that faces the first carrier 104. Mounting may entail aligning the electronic devices 120 and 124 with the current-carrying device 108 and then bonding them to the current-carrying device 108. In the illustrated example, two electronic devices 120 and 124 are shown but any number of electronic devices may be mounted to the current-carrying device 108 during this stage of fabrication.

The electronic devices 120 and 124 may be initially provided in a prefabricated (pre-assembled) form, meaning the electronic devices 120 and 124 were fabricated or assembled prior to carrying out the presently described method for fabricating the flexible electronic assembly. A prefabricated electronic device may, for example, be a fully fabricated or assembled (and tested) electronic device. Some prefabricated electronic devices may be fully fabricated or assembled at the time of being provided for the present method except for still requiring a final processing step of thinning the base substrates of such devices. Such devices may be referred to herein as "thinnable" prefabricated electronic devices. Thus, prefabricated electronic devices mounted to the current-carrying device 108 may be commercially off-the-shelf (COTS) die, previously singulated from wafers that are the end products of a wafer-level device manufacturing process. As another example, a prefabricated electronic device may be essentially fully functional for its intended purpose upon being placed in electrical communication with an appropriate voltage source or circuit. Prior to being provided or introduced to the presently described method, a prefabricated electronic device may have previously been operatively coupled to an electronics testing apparatus and evaluated as a device-under-test (DUT). A prefabricated electronic device may be an active or passive electronic device. Further, a prefabricated electronic device may be a radio frequency (RF) device, an optoelectronic device, or a micro-electromechanical systems (MEMS) device. A few specific examples of prefabricated electronic devices include, but are not limited to, a microprocessor, a microcontroller, an analog or digital signal processor (DSP), an amplifier, an integrated circuit (IC), an application-specific integrated circuit (ASIC), a field-programmable gate array (FPGA), a memory, a monolithic microwave integrated circuit (MMIC), an RF or microwave (MW) transmission line of planar geometry (e.g., microstrip, stripline, etc.), a waveguide, an antenna, a resonant cavity or oscillator, an impedance matching network, a thermoelectric device, a detector, sensor or transducer, etc.

The electronic devices 120 and 124 include respective front sides and opposing back sides. The front sides are referred to as contact sides (or component sides) 128 and 132 at which electrical contacts (e.g., circuit features such as contact pads, etc.) are located. The back sides may be the outer surfaces of base substrates of the electronic devices 120 and 124. Thus, for example, the electronic devices 120 and 124 may be die as noted above, in which case the electrical contacts may have been fabricated on the base substrates as part of a wafer-level device manufacturing process. Electrical connections between the electrical contacts of the contact sides 128 and 132 and corresponding metal components 112 of the current-carrying device 108 are eventually made during the presently described fabrication process. Hence, the electronic devices 120 and 124 are mounted "face-down" on the current-carrying device 108 in that the electronic devices 120 and 124 are oriented such that the contact sides 128 and 132 face the current-carrying device 108.

Before being bonded to the current-carrying device 108, the electronic devices 120 and 124 are aligned with the current-carrying device 108. That is, the electrical contacts of the electronic devices 120 and 124 are aligned with predesignated, corresponding contact points of the current-carrying device 108. Any suitable bonding technique may be utilized. For example, the electronic devices 120 and 124 may be bonded to the current-carrying device 108 by applying a layer or film of a bonding agent 136 (e.g., adhesive) to the current-carrying device 108 or to the contact sides 128 and 132 of the electronic devices 120 and 124, and then moving the aligned electronic devices 120 and 124 into contact with the current-carrying device 108. The bonding agent 136 may be activated or cured by pressure, heat, compression, or ultraviolet (UV) light. The bonding agent 136 may be, for example, an epoxy adhesive or a polymer adhesive. In some embodiments, the bonding agent 136 is applied as a layer (e.g., by spin-on coating) on the current-carrying device 108, and then is patterned to match the areas at which the electronic devices 120 and 124 are to be positioned on the current-carrying device 108. In other embodiments, the bonding agent 136 is dispensed in a controlled fashion onto the areas of the current-carrying device 108 at which the electronic devices 120 and 124 are to be positioned. In one specific yet non-limiting example, the electronic devices 120 and 124 are mounted to the current-carrying device 108 by a die-to-wafer (D2W) aligned bonding process in which the bonding agent 136 utilized is un-patterned spun-on, UV-curable, epoxy-based photoresist known as SU-8.

Figure 3:
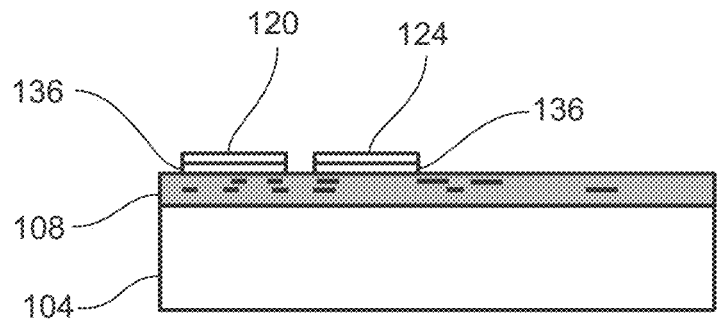
FIG. 3 is a schematic cross-sectional view illustrating the method, in which the electronic devices shown in FIG. 2 are subjected to a thinning process while mounted to the current-carrying device.

Referring to FIG. 3, after bonding, the thinnable electronic devices 120 and 124 are subjected to an appropriate thinning process. Generally, the thinning process entails removing material from the base (or bulk) substrates of the electronic devices 120 and 124 until a desired thickness of the electronic devices 120 and 124 is obtained. The thinning process may be a mechanical thinning process such as, for example, mechanical grinding (e.g., wafer-level backgrinding) or diamond grinding. Alternatively or additionally, the thinning process may include a dry etching (plasma thinning) process in which the etching agent is one or more species (e.g., oxygen species) of an active plasma, or a wet chemical process. In some embodiments, the thinning process may include a coarse or main thinning process followed by a fine thinning process. The coarse or main thinning process reduces the initial thickness of the electronic devices 120 and 124 down to (or close to) the desired final thickness. The fine thinning process then reduces the thickness more precisely down to the desired final thickness and/or removes mechanical flaws resulting from the coarse or main thinning process. In some embodiments, the coarse or main thinning process may be a mechanical thinning process and the fine thinning process may be a dry etching process. The thinning process selected may be one that enables all thinnable electronic devices mounted to the current-carrying device 108 to undergo thinning at the same time (i.e., during the same thinning process step(s)). The final thickness of the thinned electronic devices 120 and 124 may be generally on the order of micrometers (μm). In some embodiments, the final thickness is in a range from 10 to 100 μm. In other embodiments, the final thickness is in a range from 20 to 30 μm.

Figure 4:
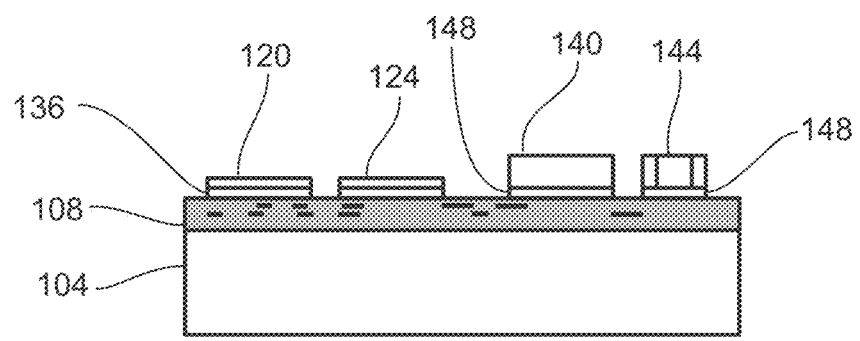
FIG. 4 is a schematic cross-sectional view illustrating the method, in which additional, non-thinnable electronic devices are mounted face-down on the back side of the current-carrying device.

Referring to FIG. 4, in some embodiments, the flexible electronic assembly includes one or more other prefabricated electronic devices 140 and 144 that cannot be thinned due to their inherent structure or configuration. Such devices may be referred to herein as "non-thinnable" devices. Such devices may, for example, have a three-dimensional (3D) bulk structure or vertically stacked multilayer structure that does not present a base substrate or excess amount of substrate material that could be sacrificed, or may be provided in a packaged format that cannot be disturbed, etc. Examples of such devices may include, but are not limited to, certain types of oscillators, passive devices, and MEMS devices. More generally, such devices may include certain types of the devices specified above as examples of thinnable devices. These electronic devices 140 and 144 may be mounted (aligned and bonded) face-down on the current-carrying device 108 in the same or similar manner as described above in regard to the electronic devices 120 and 124, using an appropriate bonding agent 148.

Figure 5:
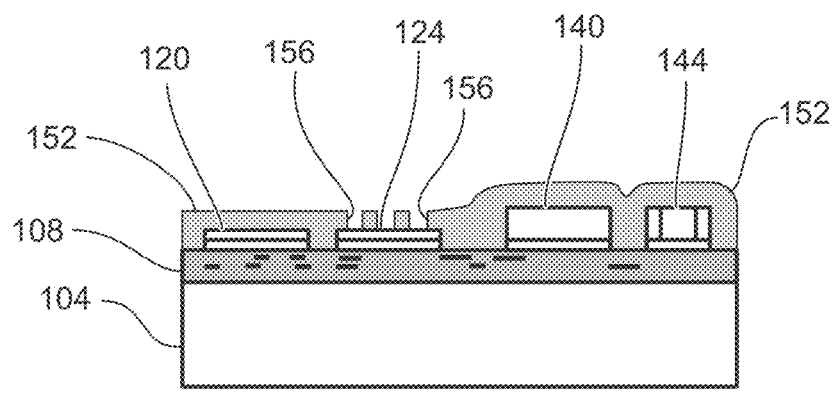
FIG. 5 is a schematic cross-sectional view illustrating the method, in which a flexible substrate is formed on the current-carrying device so as to conformally cover the electronic devices shown in FIG. 4, and vias are formed in the flexible substrate.

Referring to FIG. 5, a flexible substrate 152 is then formed so as to conformally cover all electronic devices 120, 124, 140, and/or 144 mounted to the current-carrying device 108 and all exposed areas of the current-carrying device 108.

Typically, the flexible substrate 152 is composed of an electrically insulating (or dielectric) organic polymer that is flexible due to its inherent compositional structure and/or its small thickness (e.g., on the order of tens of micrometers). Examples of suitable polymers include, but are not limited to, polyimide (including copolymers and blends of polyimide), polyparaxylylene (e.g., the class of Parylenes), liquid-crystal polymers (LCPs), and benzocyclobutene (BCB). One non-limiting example of a suitable LCP is ULTRALAM® 3850 laminate material commercially available from Rogers Corporation, Rogers, Conn., USA. The polymer may or may not be photo-definable. Depending on the embodiment, the flexible substrate 152 may be formed by a deposition or coating technique, such as those given by example above. Other material-additive processes, however, may be suitable, such as high-temperature lamination in the case of LCPs. Using a suitable adhesive layer, the flexible substrate 152 may be applied using low temperature lamination. In some embodiments, the maximum thickness of the flexible substrate 152 (as measured from the surface of the underlying current-carrying device 108) is in a range from 50 to 200 µm.

Next, in some embodiments, one or more vias 156 may be formed through the thickness of the flexible substrate 152 in preparation for forming electrical ground or thermal connections to the back side(s) of one or more of the electronic devices 120, 124, 140, and 144. Vias may also be formed in preparation for forming connections to one or more components subsequently added to the flexible substrate 152 (e.g., power sources such as batteries). The vias may be formed by any technique suitable for the composition of the flexible substrate 152 and utilized in precision microfabrication, such as for example micromachining (e.g., mechanical drilling, laser drilling, ultrasonic milling, etc.), wet (chemical) etching, or dry (plasma) etching. While not shown, the vias 156 may also be formed through the flexible substrate 152 to one or more of the metal components 112 of the current carrying device 108.

Figure 6:
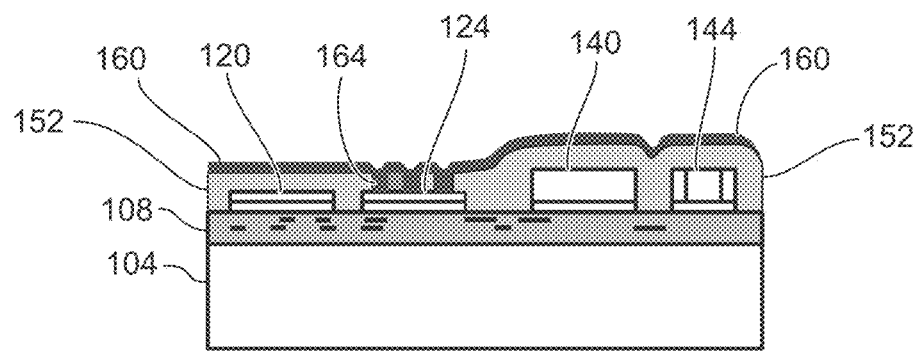
FIG. 6 is a schematic cross-sectional view illustrating the method, in which an electrically conductive layer is formed on a back side of the flexible substrate and interconnects are formed in the vias of the flexible substrate shown in FIG. 5.

Referring to FIG. 6, metal (e.g., copper, copper alloy, other metals or metal alloys) is then deposited on the back side of the flexible substrate 152 to form an electrically conductive layer 160 that conformally covers the flexible substrate 152. The as-deposited metal also fills in or at least conformally lines the inside surfaces of the vias 156 (FIG. 5) to form vertical interconnects 164 that provide ground and thermal contacts between the electrically conductive layer 160 and the back sides of whichever electronic devices 120, 124, 140, and 144 are aligned with the vias 156.

Figure 7:
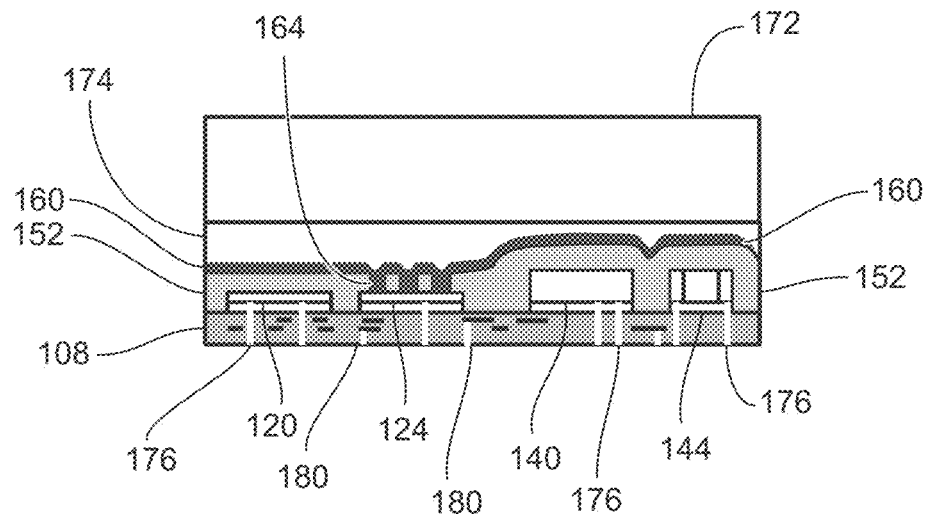
FIG. 7 is a schematic cross-sectional view illustrating the method, in which the first carrier shown in FIGS. 1 to 6 is removed, a second carrier is attached at the back side of the electrically conductive layer shown in FIG. 6, and vias are formed in the current-carrying device.

Referring to FIG. 7, after forming the electrically conductive layer 160, a second carrier 172 is then bonded to the back side of the electrically conductive layer 160 using an appropriate temporary adhesive 174 such as LC5320 adhesive commercially available from 3M, St. Paul, Minn., USA. Like the first carrier 104, the second carrier 172 serves as a temporary carrier to provide mechanical support for subsequent processing steps and may be composed of the same or similar material as the first carrier 104. Before or after attaching the second carrier 172, the first carrier 104 (FIG. 6) is removed to expose the front side of the current-carrying device 108. Any technique suitable for the composition of the first carrier 104 and the current-carrying device 108 may be utilized to remove the first carrier 104 such as, for example, mechanical sawing, mechanical polishing, chemical-mechanical polishing (CMP), laser ablation, dry etching, or wet (chemical) etching. In embodiments for which the first carrier 104 is silicon or the like, deep reactive ion etching (DRIE), CMP and/or chemical spin etching may be utilized.

After removing the first carrier 104, vias are formed in the electrically insulating material 116 of the current-carrying device 108 in preparation for forming vertical interconnects in the current-carrying device 108. Some vias 176 may be formed through the entire thickness of the current-carrying device 108 to expose electrical contacts of one or more of the electronic devices 120, 124, 140 embedded in the flexible substrate 152. Other vias 180 may be formed through part of the thickness of the current-carrying device 108 to expose portions of the electrically conductive material 112 disposed at one or more different levels of the current-carrying device 108.

Figure 8:
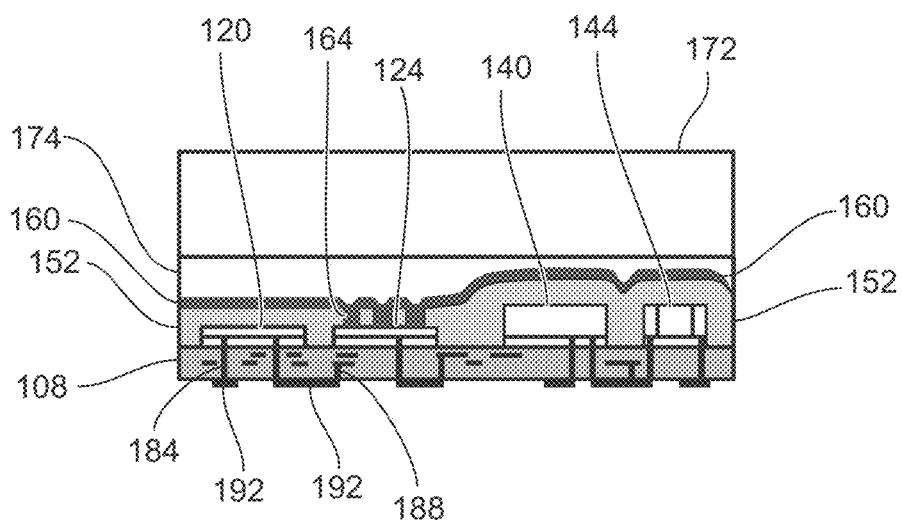
FIG. 8 is a schematic cross-sectional view illustrating the method, in which interconnects are formed in the vias of the current-carrying device shown in FIG. 7, and contact pads communicating with the interconnects are formed on a front side of the current-carrying device.

Referring to FIG. 8, metal is then deposited by any suitable technique (e.g., vacuum deposition, electroplating, etc.) on the front side of the current-carrying device 108 to form an electrically conductive (metallization) layer thereon. The as-deposited metal also fills in or at least conformally lines the inside surfaces of the vias 176 and 180 (FIG. 7) to form, respectively, vertical interconnects 184 that provide electrical communication between the electrically conductive components of whichever electronic devices 120, 124, 140, and 144 are aligned with the vias 176, and other vertical interconnects 188 that provide electrical communication between the electrically conductive layer and portions of the electrically conductive material disposed at one or more different levels of the current-carrying device 108. The electrically conductive material is then patterned by any suitable technique (e.g., photolithography) to form electrically conductive structures 192 on the front side of the current-carrying device 108, such that each electrically conductive structure 192 is in electrical communication with at least one of the interconnects 184 or at least one of the other interconnects 188. Depending on the pattern, a given electrically conductive structure 192 may be a contact pad communicating with one of the interconnects 184 or 188, or a planar interconnect or trace interconnecting two or more of the interconnects 184 and/or 188. Depending on the embodiment, a contact pad may be provided for signal communication or power supply. Thus, for example, the contact pad may be subsequently placed in electrical communication with an electronic device or circuit (not shown) external to the flexible electronic assembly or an electronic device or circuit (not shown) mounted to the front side of the current-carrying device 108.

Figure 9:
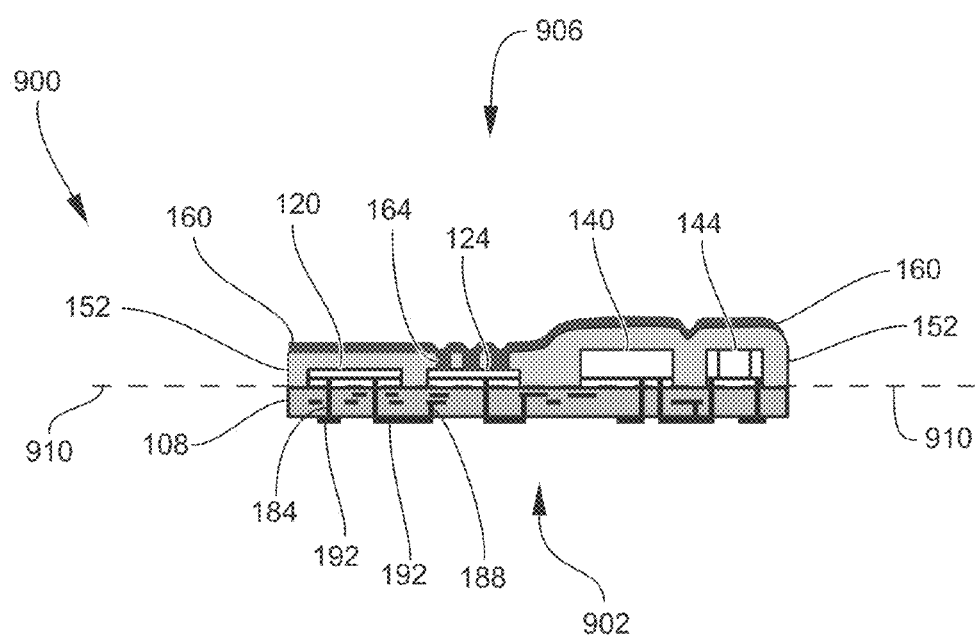
FIG. 9 is a schematic cross-sectional view illustrating the method, in which the second carrier is removed, resulting in a free-standing flexible electronic assembly.

Referring to FIG. 9, after forming the interconnects 184 and 188 and electrically conductive structures 192, the second carrier 172 and temporary adhesive 174 are then removed, resulting in a free-standing flexible electronic assembly 900. As appreciated by persons skilled in the art, other post-bonding, post-release (debonding) and finishing steps may be implemented as needed to complete the fabrication of the flexible electronic assembly 900 so as to impart or ensure a desired structural and/or functional configuration.

After fabrication/assembly is complete, and depending on the embodiment, power may be supplied to the flexible electronic assembly 900 by coupling electrical leads to certain contact pads 192 on the front side of the current-carrying device 108, or by mounting a suitable power source (e.g., battery) in electrical communication with certain contact pads 192 of the current-carrying device 108 or with contact pads (not shown) formed from the electrically conductive layer 160 on the back side of the flexible substrate 152.

As shown in FIG. 9, the flexible electronic assembly 900 generally has a front side 902 and an opposing back side 906 spaced from the front side 902 along the vertical direction. In the present embodiment, the front side 902 corresponds to the front side of the flexible current-carrying device 108, and the back side 906 corresponds to the back side of the flexible substrate 152 (or the back side of the electrically conductive layer 160 coating the flexible substrate 152, if provided). The flexible substrate 152 is formed on the flexible current-carrying device 108 such that the front side of the flexible substrate 152 contacts the back side of the flexible current-carrying device 108 at a planar interface (or interfacial region) 910 (depicted by a dashed line) between the front side 902 and the back side 906. Moreover, the electronic devices 120, 124, 140, and 144 are mounted on the flexible current-carrying device 108 such that the front sides of the electronic devices 120, 124, 140, and 144 contact the back side of the flexible current-carrying device 108 at the interface 910. Meanwhile, the electronic devices 120, 124, 140, and 144 are embedded in the flexible substrate 152. By this configuration, the electronic devices 120, 124, 140, and 144 are coplanar with each other, and both the flexible substrate 152 and the electronic devices 120, 124, 140, and 144 are coplanar with the flexible current-carrying device 108 at the interface 910.

The configuration provided by the flexible electronic assembly 900 (and the fabrication method described above), particularly the coplanar integration of contact surfaces as just described, may offer a number of advantages in addition to being physically flexible. First, the configuration may simplify interconnect design and processing as it avoids the need for sidewall interconnects and allows for the use of interconnect methods, such as employed in the fabrication of MLMs of semiconductor ICs, which can be a significant benefit for high performance devices such as, for example, RF circuits. Second, the configuration enables thinning of die instead of requiring the use of full wafers of components. Third, the configuration is highly versatile, enabling the integration of any traditional circuit device or component, such as those described above in conjunction with FIG. 2. Fourth, the configuration enables the integration of COTS electronic devices. Fifth, the configuration may enable rapid turnaround from concept to demonstration. For example, the configuration does not require custom CMOS foundry processes that can take several months to over a year. Sixth, the configuration enables integration of dissimilar materials and different die thicknesses. Further, such integration is implemented in a manner that results in the electrically interconnected surfaces being coplanar as described above, which again allows for the use traditional interconnect methods.

As a further advantage, the configuration and fabrication method enable the flexible electronic assembly 900 to be ultra-thin. The thickness of the flexible electronic assembly 900 may be defined along the vertical direction from the front side 902 to the back side 906. Insofar as the thickness of the flexible electronic assembly 900 may vary from one end to another end (for example, in FIG. 9 the thickness varies from the left end to the right end), the term "thickness" may refer to an overall thickness or maximum thickness of the flexible electronic assembly 900. In some embodiments, the (maximum) thickness of the flexible electronic assembly 900 is 2000 µm or less. In other embodiments, the (maximum) thickness of the flexible electronic assembly 900 is in a range from 10 µm to 2000 µm. In other embodiments, the (maximum) thickness of the flexible electronic assembly 900 is in a range from 10 µm to 1000 µm. In other embodiments, the (maximum) thickness of the flexible electronic assembly 900 is in a range from 10 µm to 750 µm. In other embodiments, the (maximum) thickness of the flexible electronic assembly 900 is in a range from 50 µm to 750 µm. In other embodiments, the (maximum) thickness of the flexible electronic assembly 900 is 100 µm or less. In other embodiments, the (maximum) thickness of the flexible electronic assembly 900 is in a range from 10 µm to 100 µm.

The flexibility of the current-carrying device 108 and the substrate 152 contribute in large part to the overall flexibility of the flexible electronic assembly 900 as a whole. This flexibility may be due to the materials utilized, the thinness of the flexible electronic assembly 900, or a combination of both. In the context of the present disclosure, the term "flexible" generally means that the flexible electronic assembly 900 may be bent or bowed one or more times and at one or more locations of the flexible electronic assembly 900 without mechanical or operational failure, at least in the normal course of its intended use. For example, the flexible electronic assembly 900 may be mounted to a variety of curved surfaces having a range of contours or profiles and over a range of radii of curvatures. In some embodiments, the flexible electronic assembly 900 may be cycled through a very large number of bending/bowing events without failure. In some embodiments, the flexible electronic assembly 900 may be rolled into a cylinder. Referring to FIG. 9, for example, the flexible electronic assembly 900 may be rolled into a cylinder such that the two opposing laterals sides (e.g., the left side and right side in FIG. 9) meet or overlap each other. In some applications, the flexible electronic assembly 900 may be rolled into a cylinder, threaded through an aperture, and then allowed to return to a flatter or straighter orientation such as shown in FIG. 9.

After fabrication/assembly is complete, the flexible electronic assembly 900 may be utilized in a wide range of applications, particularly applications that require or would benefit from the physical flexibility and thinness of the flexible electronic assembly 900. Such applications may include, for example, traditional electronics or MEMS applications involving signal processing and/or measurement, detection, and sensing, as well as consumer electronics, surveillance, information gathering, instrument diagnostics, medical diagnostics, personalized medicine, and in vitro and in vivo implantations.

In some embodiments, a barrier layer (passivation layer) may be deposited so as to conformally encapsulate the flexible electronic assembly 900. Such a barrier layer may be patterned so as to provide access to contact pads of the flexible electronic assembly 900 that require coupling to external components. The barrier layer may have any suitable composition utilized in the packaging of electronics. For example, the barrier layer may have a composition selected from the examples of materials specified above in conjunction with the flexible current-carrying device 108 and the flexible substrate 152. The barrier layer may be engineered or treated (e.g., surface functionalized, doped, etc.) as needed to impart or enhance desired surface properties such as, for example, low moisture permeability, low oxygen permeability, hydrophilicity or hydrophobicity, lipophilicity or lipophobicity, etc. As another example, in some embodiments the flexible electronic assembly 900 may be intended for in vivo or in vitro implantation and operation, in which case the flexible electronic assembly 900 should be biocompatible. Biocompatibility may require that the flexible electronic assembly 900 after implantation be conformable to surrounding tissue so as not to physically damage the tissue. In this regard, in various embodiments the flexible electronic assembly 900 is sufficiently flexible so as to meet the conformability requirements associated with biocompatibility. Biocompatibility may require that the flexible electronic assembly 900 after implantation not have toxic or otherwise injurious effects at either the local level (e.g., surrounding tissue) or the systemic level. Depending on the materials utilized, a barrier layer may need to be added to the flexible electronic assembly 900 to meet a requirement of non-toxicity or similar physiological requirement.

Figure 10:
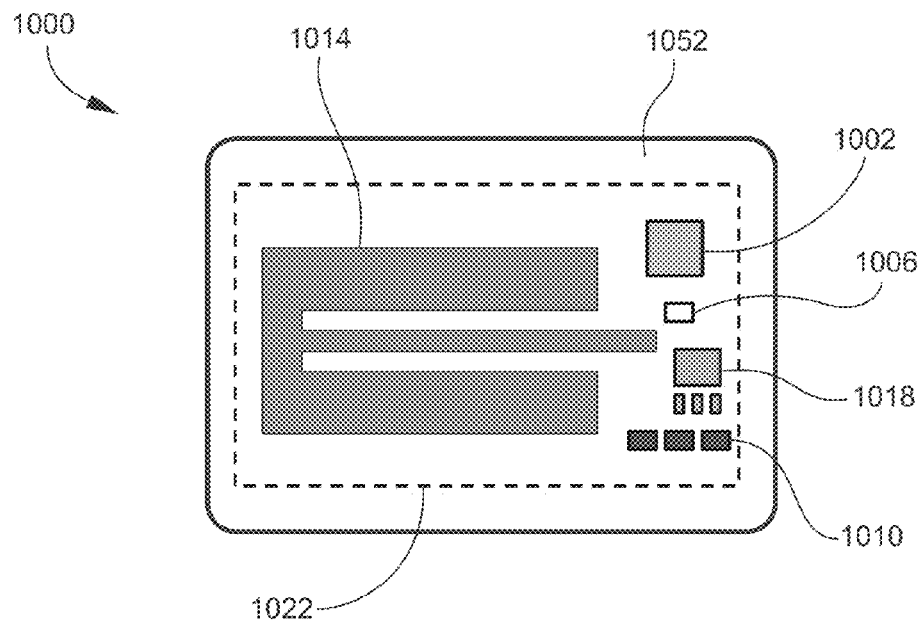
FIG. 10 is a plan view of another example of a flexible electronic assembly 1000 that may be fabricated according to the methods disclosed herein.

FIG. 10 is a plan view of another example of a flexible electronic assembly 1000 that may be fabricated according to the methods disclosed herein. The flexible electronic assembly 1000 includes a flexible substrate 1052 as described above. FIG. 10 illustrates a few examples of components that may be embedded in the flexible substrate 1052 as part of the fabrication process, such as a microcontroller 1002, an RF amplifier 1006, other active devices 1010 (e.g., sensors, emitters, signal processors, etc.), an antenna 1014, and other passive components 1018 (e.g., for power management). Also shown is a hybrid ground plane/power source 1022 on the opposite side of the flexible electronic assembly 1000, which may communicate with one or more of the afore-mentioned devices and components through interconnects as described above.

Figure 11:
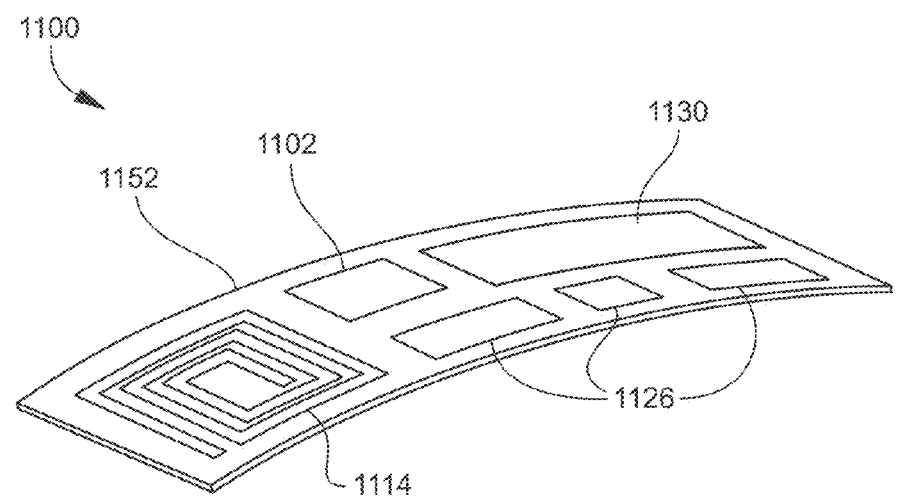
FIG. 11 is a plan view of another example of a flexible electronic assembly 1100 that may be fabricated according to the methods disclosed herein.

FIG. 11 is a plan view of another example of a flexible electronic assembly 1100 that may be fabricated according to the methods disclosed herein. In this example, a microcontroller 1102, an antenna 1114, and various other active and/or passive devices 1126 are embedded in a flexible substrate 1152. Also shown is an ultrathin battery 1130 embedded in the flexible substrate 1152 on the same side of the flexible electronic assembly 1100 as the foregoing components.

It will be understood that in the fabrication methods described herein, prior to forming any layer or structure on an underlying surface or prior to mounting any structure or device on an underlying surface, additional steps may be taken as needed to prepare the underlying surface such as, for example, cleaning, etching, planarizing (e.g., lapping or polishing), dehydration by baking, surface functionalization (e.g., adhesion promotion, passivation, etc.), etc. Such additional steps may or may not involve the application or formation of a thin film on the underlying surface, which thin films are not specifically shown in the drawing figures.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A flexible electronic assembly, comprising:
a flexible current-carrying device comprising a front side, an opposing back side, a first electrically insulating material, and a metal component embedded in the first electrically insulating material;
a flexible substrate composed of a second electrically insulating material and comprising a front side and an opposing back side; and
an electronic device embedded in the flexible substrate and comprising a front side, an opposing back side, and an electrical contact on the front side, wherein:
the front side of the flexible substrate and the front side of the electronic device contact the back side of the flexible current-carrying device at an interface, such that the front side of the flexible substrate and the front side of the electronic device are coplanar with the back side of the flexible current-carrying device at the interface; and
the flexible current-carrying device further comprises:
at least one contact pad on the front side of the flexible current-carrying device;
a first interconnect connected between the at least one contact pad and the metal component of the flexible current-carrying device; and
a second interconnect connected between the at least one contact pad and the electrical contact of the electronic device.

2. The flexible electronic assembly of claim 1, wherein the flexible electronic assembly has a maximum thickness between the front side of the flexible current-carrying device and the back side of the flexible substrate, and the thickness is 100 μm or less, or is in a range from 50 μm to 750 μm.

3. The flexible electronic assembly of claim 1, wherein the first electrically insulating material and the second electrically insulating material have compositions selected from the group consisting of glasses, quartz, non-conductive oxides, non-conductive nitrides, diamond-like carbon, ceramics, organic polymers, photoresists, polyimides, parylenes, liquid crystal polymers, and benzocyclobutene.

4. The flexible electronic assembly of claim 1, wherein the electronic device is a prefabricated electronic device.

5. The flexible electronic assembly of claim 1, wherein:
the electronic device comprises a plurality of electronic devices, each electronic device comprising a front side, an opposing back side, and an electrical contact on the front side; and
the front side of each electronic device contacts the back side of the flexible current-carrying device at the interface, such that the electronic devices are coplanar with each other and with the flexible current-carrying device at the interface.

6. The flexible electronic assembly of claim 5, wherein:
the plurality of electronic devices comprises a thinned electronic device and a non-thinned electronic device having a thickness greater than a thickness of the thinned electronic device; and the flexible substrate conformally coats the thinned electronic device and the non-thinned electronic device such that the flexible substrate has a varying thickness between the front side of the flexible substrate and the back side of the flexible substrate.

7. The flexible electronic assembly of claim 1, comprising an electrically conductive layer conformally disposed on the back side of the flexible substrate.

8. The flexible electronic assembly of claim 7, wherein the flexible substrate comprises an interconnect connected between the electronic device and the electrically conductive layer.

9. The flexible electronic assembly of claim 1, wherein the flexible current-carrying device comprises a multilevel metal (MLM) structure.

10. The flexible electronic assembly of claim 9, wherein:
the MLM structure comprises a first patterned layer and a second patterned layer embedded in the first electrically insulating material at one or more respective levels between the front side and the back side of the flexible current-carrying device, the first patterned layer comprising at least a first metal component and the second patterned layer comprising at least a second metal component; and
the metal component to which the first interconnect is connected is the first metal component of the first patterned layer.

11. The flexible electronic assembly of claim 1, wherein:
the at least one contact pad comprises a first contact pad and a second contact pad on the front side of the flexible current-carrying device;
the first interconnect is connected between the first contact pad and the metal component; and
a second interconnect connected between the second contact pad and the electrical contact of the electronic device.

12. The flexible electronic assembly of claim 9, comprising an electrically conductive layer conformally disposed on the back side of the flexible substrate.

13. The flexible electronic assembly of claim 1, comprising a barrier layer conformally coating the flexible electronic assembly.

14. A method for fabricating a flexible electronic assembly, the method comprising:
forming a flexible current-carrying device comprising a front side, an opposing back side, a first electrically insulating material, and a metal component embedded in the first electrically insulating material;
mounting an electronic device on the flexible current-carrying device, the electronic device comprising a front side, an opposing back side, and an electrical contact on the front side, wherein the front side of the electronic device contacts the back side of the flexible current-carrying device at an interface;
forming a flexible substrate on the flexible current-carrying device such that the electronic device is embedded in the flexible substrate, the flexible substrate composed of a second electrically insulating material and comprising a front side and an opposing back side, wherein the front side of the flexible substrate contacts the back side of the flexible current-carrying device at the interface, and the front side of the flexible substrate and the front side of the electronic device are coplanar with the back side of the flexible current-carrying device at the interface; and forming at least one contact pad on the front side of the flexible current-carrying device and a first interconnect and a second interconnect in the flexible current-carrying device, wherein the first interconnect is connected between the at least one contact pad and the metal component of the flexible current-carrying device, and the second interconnect is connected between the at least one contact pad and the electrical contact of the electronic device.

15. The method of claim 14, comprising providing the electronic device as a prefabricated electronic device, wherein mounting comprises mounting the prefabricated electronic device on the flexible current-carrying device.

16. The method of claim 14, comprising, after mounting the electronic device and before forming the flexible substrate, thinning the electronic device.

17. The method of claim 15, wherein after thinning, the electronic device has a thickness between the front side of the electronic device and the back side of the electronic device in a range from 50 μm to 250 μm.

18. The method of claim 14, wherein mounting the electronic device comprises mounting a plurality of electronic devices on the flexible current-carrying device, each electronic device comprising a front side, an opposing back side, and an electrical contact on the front side, and wherein the front side of each electronic device contacts the back side of the flexible current-carrying device at the interface, such that the electronic devices are coplanar with each other and with the flexible current-carrying device at the interface.

19. The method of claim 18, comprising, after mounting the electronic devices and before forming the flexible substrate, thinning at least one of the electronic devices to form a thinned electronic device, wherein:
the plurality of electronic devices comprises a non-thinned electronic device having a thickness greater than a thickness of the thinned electronic device; and
after forming the flexible substrate, the flexible substrate conformally coats the thinned electronic device and the non-thinned electronic device such that the flexible substrate has a varying thickness between the front side of the flexible substrate and the back side of the flexible substrate.

20. The method of claim 14, comprising:
forming a via into the flexible current-carrying device from the front side thereof to expose the metal component of the flexible current-carrying device or the electrical contact of the electronic device; and
depositing metal on the front side of the flexible current-carrying device to form the interconnect in the via and the contact pad on the front side of the flexible current-carrying device.

21. The method of claim 14, comprising:
forming a plurality of vias into the flexible current-carrying device from the front side thereof, wherein the plurality of vias comprises at least a first via exposing the metal component of the flexible current-carrying device and a second via exposing the electrical contact of the electronic device; and
depositing metal on the front side of the flexible current-carrying device to form at least a first interconnect in the first via, a second interconnect in the second via, a first contact pad on the front side of the flexible current-carrying device, and a second contact pad on the front side of the flexible current-carrying device, wherein the first interconnect is connected between the first contact pad and the metal component, and the second interconnect is connected between the second contact pad and the electrical contact.

22. The method of claim 14, comprising forming an electrically conductive layer that conformally coats the back side of the flexible substrate.

23. The method of claim 22, comprising, before forming the electrically conductive layer, forming a via into the flexible substrate from the back side thereof to expose the electronic device, wherein forming the electrically conductive layer forms an interconnect connected between the electronic device and the electrically conductive layer.

24. The method of claim 22, wherein forming the flexible current-carrying device comprises forming a multilevel metal (MLM) structure.

25. The method of claim 24, wherein the MLM structure comprises one or more patterned layers of metal embedded in the electrically insulating material at one or more respective levels between the front side and the back side, each patterned layer comprising a metal component.

26. The method of claim 25, wherein the one or more patterned layers comprise at least a first patterned layer and a second patterned layer, the first patterned layer comprising at least a first metal component and the second patterned layer comprising at least a second metal component, and further comprising:
forming a plurality of vias into the flexible current-carrying device from the front side thereof, wherein the plurality of vias comprises at least a first via exposing the first metal component and a second via exposing the second metal component; and
depositing metal on the front side of the flexible current-carrying device to form at least a first interconnect in the first via, a second interconnect in the second via, a first contact pad on the front side of the flexible current-carrying device, and a second contact pad on the front side of the flexible current-carrying device,
wherein the first interconnect is connected between the first contact pad and the first metal component, and the second interconnect is connected between the second contact pad and the second metal component.

27. The method of claim 24, comprising:
forming a via into the flexible current-carrying device from the front side thereof to expose the metal component of the flexible current-carrying device or the electrical contact of the electronic device; and
depositing metal on the front side of the flexible current-carrying device to form the interconnect in the via and the contact pad on the front side of the flexible current-carrying device.

28. The method of claim 24, comprising forming an electrically conductive layer that conformally coats the back side of the flexible substrate.

29. The method of claim 14, comprising forming a barrier layer that conformally coats the flexible electronic assembly.

30. The flexible electronic assembly fabricated according to the method of claim 14.

31. The flexible electronic assembly of claim 30, wherein the flexible electronic assembly has a maximum thickness between the front side of the flexible current-carrying device and the back side of the flexible substrate, and the thickness is in a range selected from the group consisting of: 2000 μm or less; 10 μm to 2000 μm; 10 μm to 1000 μm; 10 μm to 750 μm; 10 μm to 100 μm; and 50 μm to 750 μm.

* * * * *